United States Patent [19]
Suzuki

[11] Patent Number: 5,804,993
[45] Date of Patent: Sep. 8, 1998

[54] DETECTING CIRCUIT

[75] Inventor: Masayoshi Suzuki, Kawasaki, Japan

[73] Assignee: Fujitsu Limited, Kanagawa, Japan

[21] Appl. No.: 675,601

[22] Filed: Jul. 3, 1996

[30] Foreign Application Priority Data

Dec. 4, 1995 [JP] Japan .................................. 7-315173

[51] Int. Cl.⁶ .................. G01R 19/00; G06G 7/25
[52] U.S. Cl. .................... 327/58; 327/104; 327/354; 327/325
[58] Field of Search .................. 327/58, 61, 62, 327/104, 184, 354, 362, 309, 317, 325, 80, 91; 326/30

[56] References Cited

U.S. PATENT DOCUMENTS

| | | | |
|---|---|---|---|
| 3,020,420 | 2/1962 | Smee | 327/325 |
| 3,611,164 | 10/1971 | Day | 327/58 |
| 3,748,492 | 7/1973 | Baker | 327/484 |
| 3,916,221 | 10/1975 | Boyer | 327/61 |
| 4,605,864 | 8/1986 | Varadarajan et al. | 326/30 |

FOREIGN PATENT DOCUMENTS

59-103412   6/1984   Japan .

*Primary Examiner*—Toan Tran
*Attorney, Agent, or Firm*—Helfgott & Karas, P C.

[57] ABSTRACT

An inputted signal applied to an input terminal of a detecting circuit is rectified in a positive amplitude range thereof by a rectifier block and stored in a capacitor. In a negative amplitude range, the electric energy stored in the capacitor is discharged through a load block. The rectifier block and the load block have equal impedances, and hence a time constant when the capacitor is charged is equal to a time constant when the capacitor is discharged. A DC signal outputted from an output terminal of the detecting circuit has a level which is the same as the average power level of the inputted signal. The detecting circuit is capable of outputting a DC signal which is accurately representative of the power level of the inputted signal.

11 Claims, 11 Drawing Sheets

DETECTING CIRCUIT

BACKGROUND OF THE INVENTION

(1) Field of the Invention

The present invention relates to a detecting circuit for outputting a direct-current signal depending on an inputted signal power, and more particularly to a detecting circuit for use in a level detector, an alarm circuit, an AM demodulator, an automatic level control circuit, etc. in a communication device.

For example, an automatic level control circuit serves to keep the power of a transmitted signal at a predetermined level. In such an automatic level control circuit, part of a transmitted signal is extracted by a coupler or a distributor, and supplied to a detecting circuit. The transmitted signal inputted to the detecting circuit is converted into a direct-current (DC) signal corresponding to the power of the transmitted signal. The DC signal is supplied to a control circuit, which determines the difference between the DC signal and a reference signal, and controls a variable-gain amplifier or the like in order to reduce the difference for thereby keeping the power of the transmitted signal at the predetermined level.

(2) Description of the Related Art

Conventional detecting circuits will be described below with reference to FIGS. 7 and 8 of the accompanying drawings.

Figure 7:
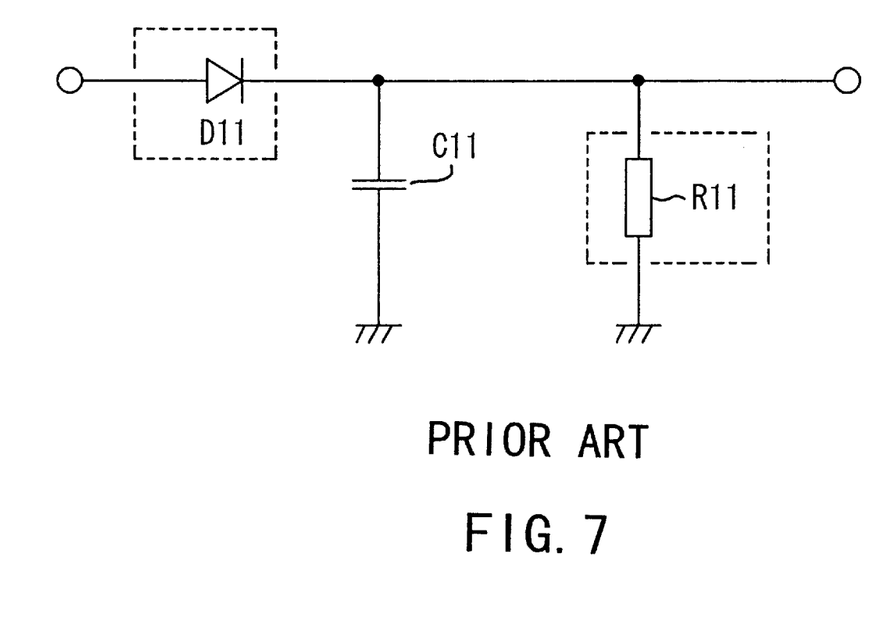
FIG. 7 is a circuit diagram of a conventional detecting circuit of the half-wave-rectification type.

FIG. 7 shows a detecting circuit of the half-wave-rectification type. In FIG. 7, an inputted signal is rectified in a positive amplitude range by a diode D11 in a rectifier block and stored in a capacitor C11. The capacitor C11 is quickly charged up to a maximum level for the rectified signal. Then, in a negative amplitude range of the inputted signal, the electric energy stored in the capacitor C11 is discharged through a resistor R11 in a load block. The electric energy stored in the capacitor C11 is relatively slowly discharged at a time constant of C11×R11 because the resistance R11 is large. The resistance R11 is of such a value as not to produce ripples in the DC component of an output signal from the detecting circuit. Since the selected value of the resistance R11 is relatively large, the electric energy stored in the capacitor C11 is slowly discharged.

Figure 8:
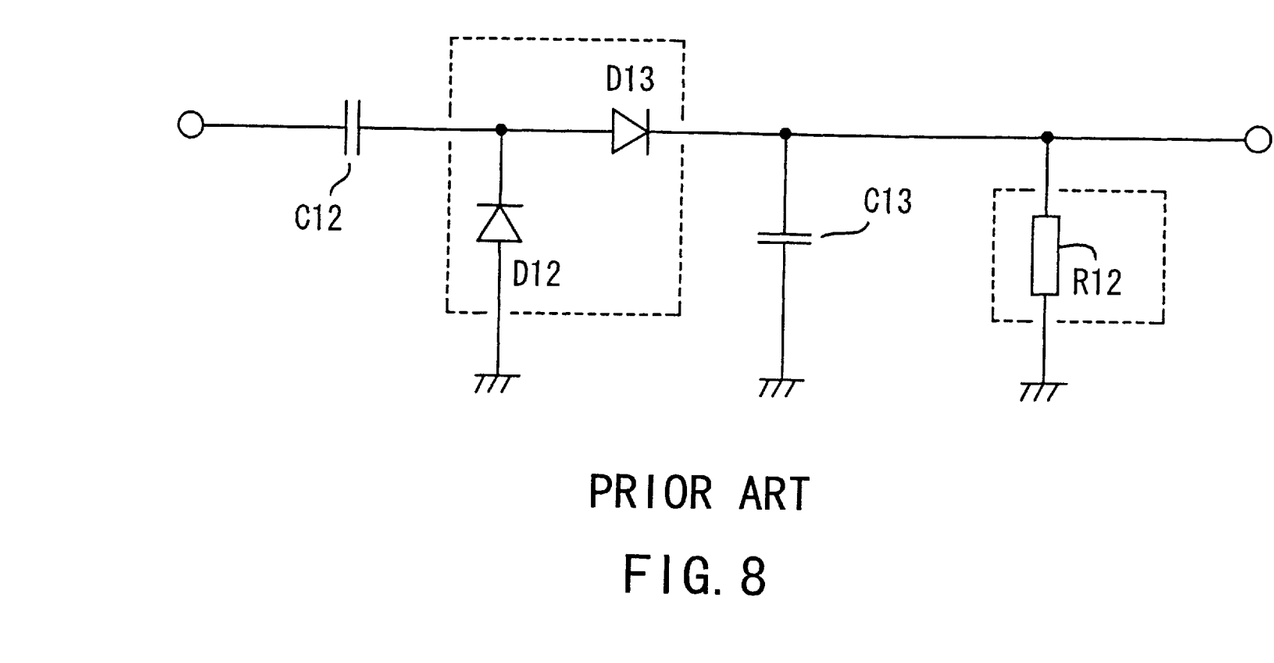
FIG. 8 is a circuit diagram of a conventional detecting circuit of the voltage-doubler-rectification type.

FIG. 8 shows a detecting circuit of the voltage-doubler-rectification type. In FIG. 8, an inputted signal is rectified in a negative amplitude range by a diode D12 in a rectifier block and stored in a capacitor C12. Then, in a positive amplitude range, the inputted signal, together with the electric energy stored in the capacitor C12, is rectified by a diode D13 in a rectifier block and stored in a capacitor C13. The capacitor C13 is quickly charged up to a voltage which is twice the voltage of the electric energy stored in the capacitor C11 shown in FIG. 7. In a next negative amplitude range, the electric energy stored in the capacitor C13 is discharged through a resistor R12 in a load block. The electric energy stored in the capacitor C13 is relatively slowly discharged at a time constant of C13×R12 because the resistance R12 is large.

In order to recognize the power level of a transmitted signal with a detecting circuit, it is necessary for the detecting circuit to output the same DC signals when signals which have the same power, but have different forms, are inputted to the detecting circuit.

However, the above conventional detecting circuits output different DC signals if signals which have the same power, but are modulated by different principles, are inputted to the detecting circuits, or output substantially the same DC signals depending on the forms of inputted signals even if they have different powers. Such problems will be described below with reference to FIGS. 9 through 11(A), 11(B).

Figure 9:
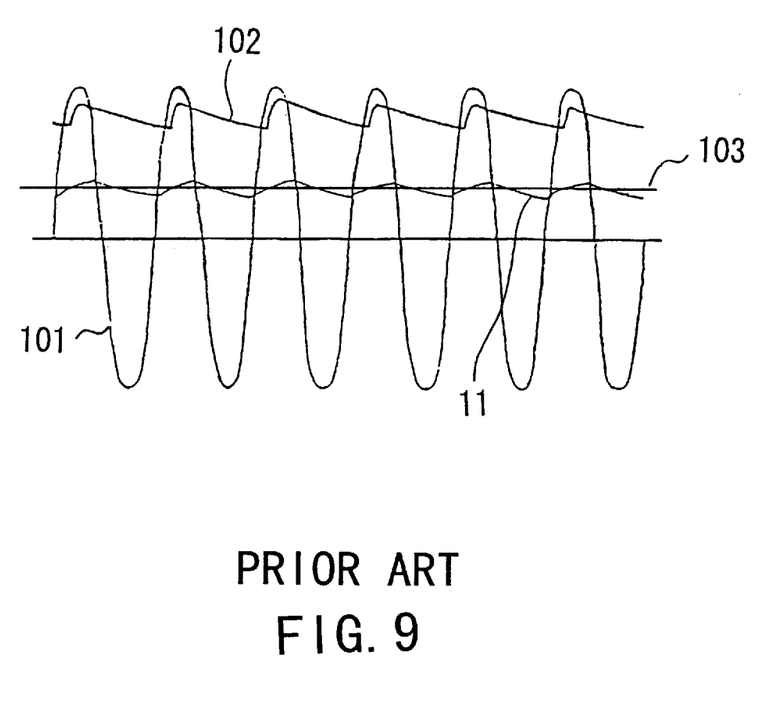
FIG. 9 is a diagram showing a DC signal outputted from the conventional detecting circuit of the half-wave-rectification type when an unmodulated sine wave is inputted to the detecting circuit.

FIG. 9 shows an output signal produced when an unmodulated sine wave 101 is inputted to the detecting circuit of the half-wave-rectification type shown in FIG. 7. As shown in FIG. 9, when the unmodulated sine wave 101 is inputted to the detecting circuit, a DC signal 102 outputted from the detecting circuit has a level positioned in the vicinity of an upper peak level of the unmodulated sine wave 101, which has an average level 103.

Figure 10:
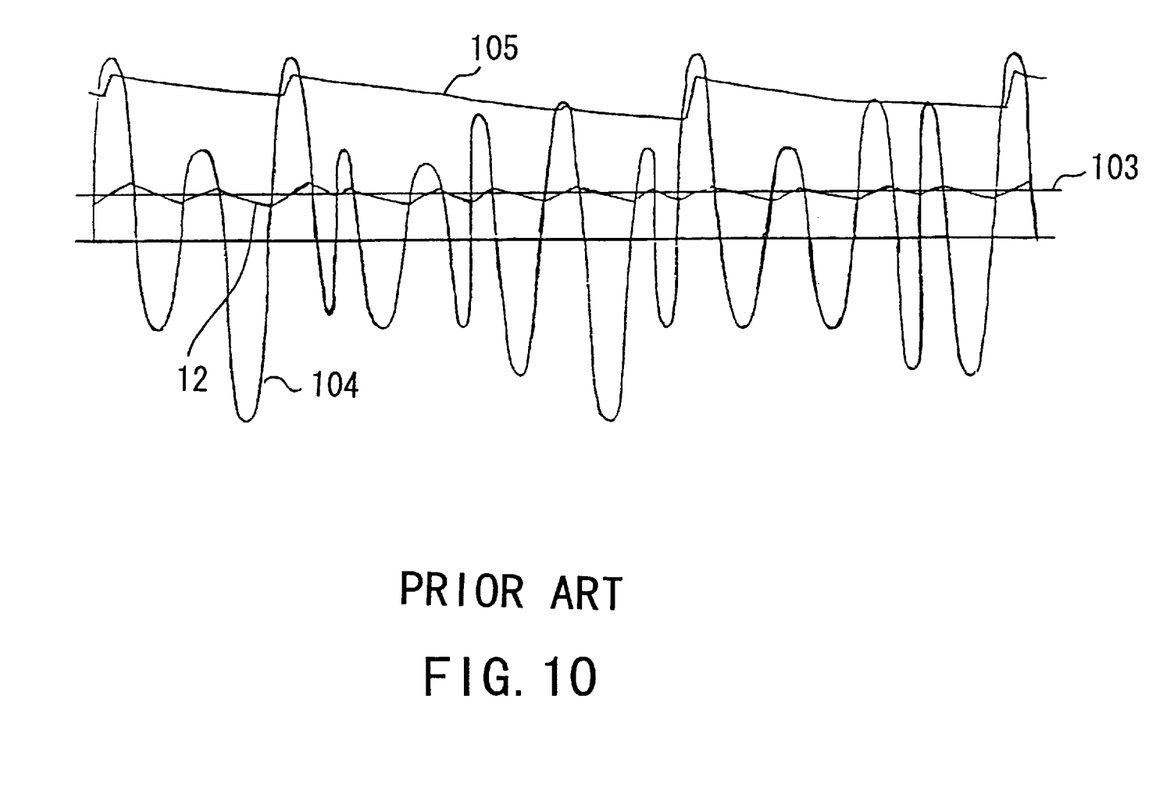
FIG. 10 is a diagram showing a DC signal outputted from the conventional detecting circuit of the half-wave-rectification type when a modulated sine wave is inputted to the detecting circuit.
Figure 11:
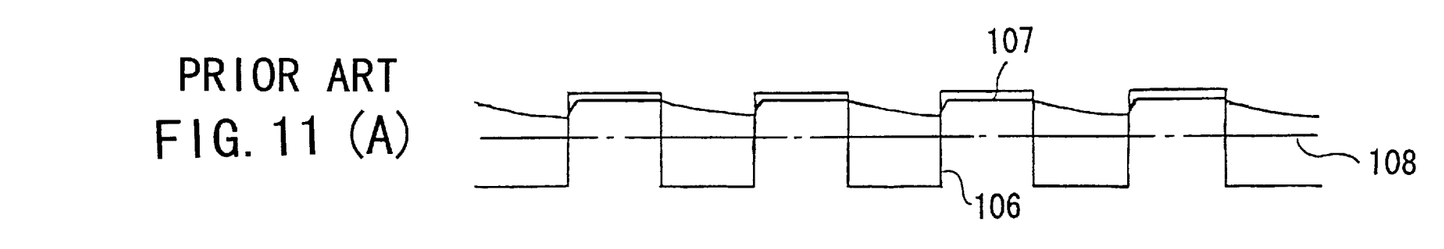
FIG. 11(A) a diagram showing a DC signal outputted from the conventional detecting circuit of the half-wave-rectification type when a rectangular wave is inputted to the detecting circuit.
FIG. 11(B) a diagram showing a DC signal outputted from the conventional detecting circuit of the half-wave-rectification type when a rectangular wave which is of the same amplitude and the same duration as, but has a different pulse frequency from, the rectangular wave shown in FIG. 11(A) is inputted to the detecting circuit.

FIG. 10 shows an output signal produced when a modulated sine wave 104 which has the same power as the sine wave 101 shown in FIG. 9 is inputted to the detecting circuit of the half-wave-rectification type shown in FIG. 7. As shown in FIG. 10, when the modulated sine wave 104 is inputted to the detecting circuit, a DC signal 105 outputted from the detecting circuit has a level positioned in the vicinity of an upper peak level of larger amplitudes of the sine wave 104.

In FIGS. 9 and 10, the levels of the outputted DC signals 102, 105 are higher than the average level 103, and even though the unmodulated sine wave 101 and the modulated sine wave 104 have the same power, the level of the outputted DC signal 105 is greater than the level of the outputted DC signal 102. This is because the capacitors are charged and discharged at different rates, stated otherwise, the time constants when the capacitors are charged and discharged are different from each other. The same phenomenon occurs in the detecting circuit of the voltage-doubler-rectification type shown in FIG. 8.

It is assumed that when modulated and unmodulated signals having equal powers are inputted to an automatic level control circuit, the above phenomenon occurs in a detecting circuit in the automatic level control circuit. When a modulated signal, for example, is inputted, since the detecting circuit outputs a large DC signal, the automatic level control circuit decides that the power of the transmitted signal is greater than a predetermined value, and lowers the gain of a variable-gain amplifier. As a result, while the gain of the variable-gain amplifier is controlled on the basis of a reference signal, the modulated transmitted signal is controlled so that its power is smaller than the predetermined value. Consequently, regardless of the fact that inputted modulated and unmodulated signals have the same powers, the power of the outputted signal produced when the transmitted signal is modulated differs from the power of the outputted signal produced when the transmitted signal is not modulated.

FIGS. 11(A) and 11(B) show output signals produced when rectangular waves having the same amplitude and the same durations, but different pulse frequencies, are inputted to the detecting circuit of the half-wave-rectification type shown in FIG. 7. As shown in FIG. 11(A), when a rectangular wave 106 is inputted to the detecting circuit, a DC signal 107 outputted from the detecting circuit has a level positioned in the vicinity of an upper peak level of the rectangular wave 106, which has an average level 108.

As shown in FIG. 11(B), when a rectangular wave 109 is inputted to the detecting circuit, a DC signal 110 outputted from the detecting circuit has a level that is substantially the same as the level of the outputted DC signal 107 shown in FIG. 11(A), i.e., positioned in the vicinity of an upper peak level of the rectangular wave 109, which has an average level 111.

In FIGS. 11(A) and 11(B), the levels of the outputted DC signals 107, 110 are higher than the average levels 108, 111, respectively, and the levels of the outputted DC signals 107, 110 are substantially the same as each other though the rectangular waves 106, 109 have different average powers. This is caused by different rates at which the capacitor in the detecting circuit is charged and discharged. The same phenomenon occurs in the detecting circuit of the voltage-doubler-rectification type shown in FIG. 8.

SUMMARY OF THE INVENTION

It is an object of the present invention to provide a detecting circuit capable of outputting a DC signal which is accurately representative of the power level of an inputted signal.

To achieve the above object, there is provided in accordance with the present invention a detecting circuit for outputting a DC signal depending on the power of an inputted signal, comprising a rectifier block connected between an input terminal and an output terminal and comprising a rectifying element and a resistive element, a capacitor having an end connected to a junction between the rectifier block and the output terminal and an opposite end connected to a common potential, and a load block connected parallel to the capacitor and having the same impedance as the rectifier block.

To achieve the above object, there is also provided in accordance with the present invention a detecting circuit for outputting a DC signal depending on the power of an inputted signal, comprising a first capacitor having an end connected to an input terminal, a rectifier block having an end connected to an opposite end of the first capacitor and an opposite end connected to an output terminal, the rectifier block being comprising at least a rectifying element and a resistive element, a second capacitor having an end connected to a junction between the rectifier block and the output terminal and an opposite end connected to a common potential, and a load block connected parallel to the second capacitor and having the same impedance as the rectifier block.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Figure 1:
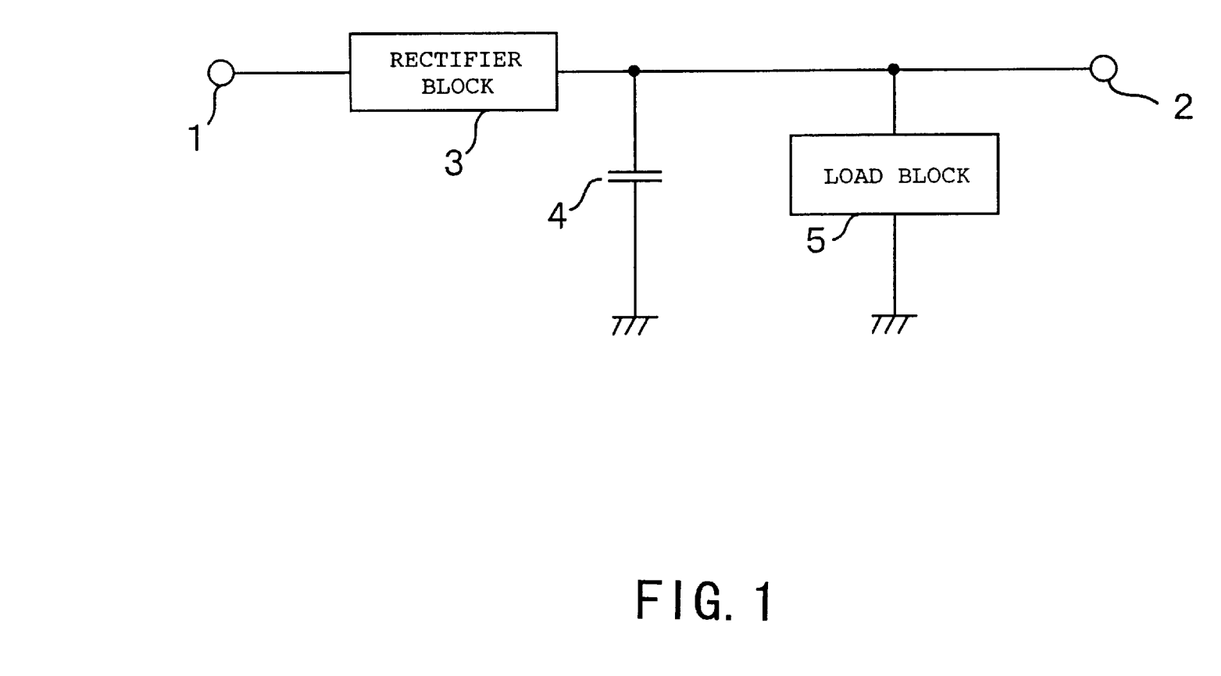
FIG. 1 is a diagram showing the principles of a first embodiment of the present invention.

The principles of a first embodiment of the present invention will first be described below with reference to FIG. 1. According to the first embodiment, a detecting circuit comprises a rectifier block 3 connected between an input terminal 1 and an output terminal 2 and comprising a rectifying element and a resistive element, a capacitor 4 having an end connected to a junction between the rectifier block 3 and the output terminal 2 and an opposite end connected to a common potential, and a load block 5 connected parallel to the capacitor 4 and having the same impedance as the rectifier block 3.

Figure 2:
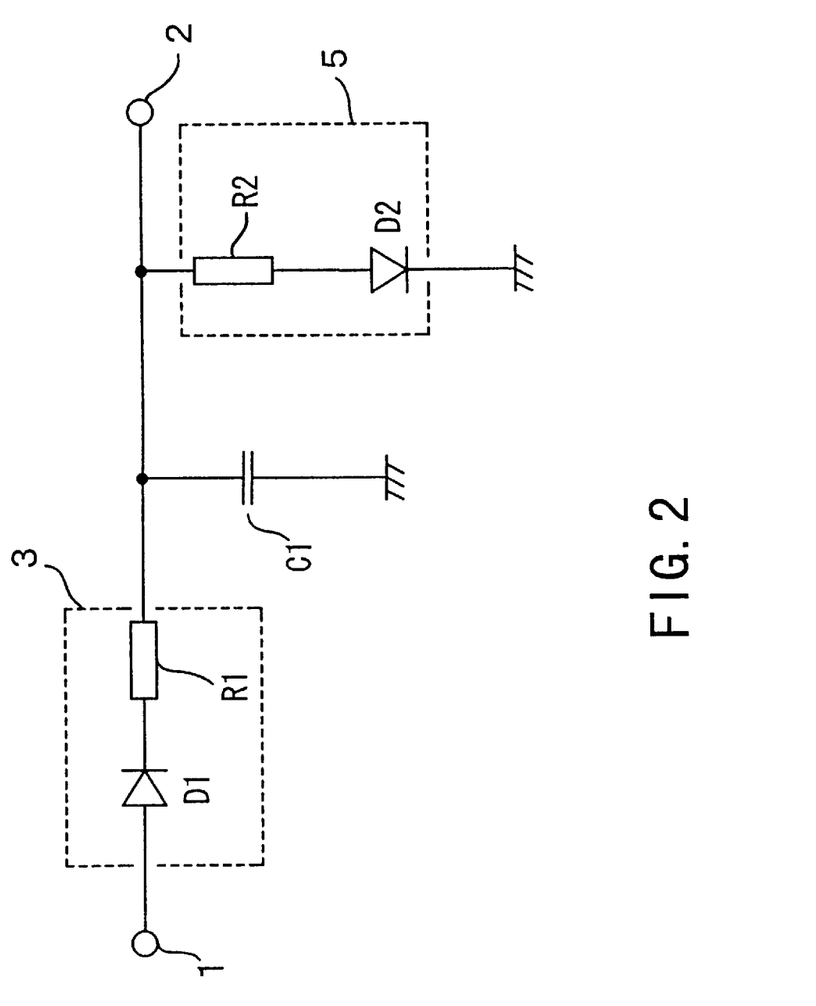
FIG. 2 is a circuit diagram of a detecting circuit according to the first embodiment of the present invention.

FIG. 2 shows in detail the detecting circuit according to the first embodiment of the present invention. As shown in FIG. 2, the rectifier block 3 comprises a series-connected circuit of a diode D1 and a resistor R1, and the load block 5 comprises a series-connected circuit of a resistor R2 and a diode D2. The capacitor 4 comprises a capacitor C1.

The diode D1 of the rectifier block 3 and the diode D2 of the load block 5 have the same characteristics as each other, and the resistor R1 of the rectifier block 3 and the resistor R2 of the load block 5 have the same characteristics as each other. Therefore, a time constant $(R1+R_{D1}) \times C1$ when the capacitor C1 is charged is equal to a time constant $(R2+R_{D2}) \times C1$ when the capacitor C1 is discharged, where $R_{D1}$, $R_{D2}$ represent resistances of the diodes D1, D2, respectively. The time constants are set to such values as to make ripples in the outputted DC signal practically free of any problems.

As a result, when an unmodulated sine wave is inputted to the input terminal 1 of the detecting circuit, the output terminal 2 thereof outputs a DC signal 11 shown in FIG. 9, which has a level substantially in agreement with the average level 103 of the inputted signal. When a modulated sine wave is inputted to the input terminal 1 of the detecting circuit, the output terminal 2 thereof outputs a DC signal 12 shown in FIG. 10, which also has a level substantially in agreement with the average level 103 of the inputted signal.

Figure 3:
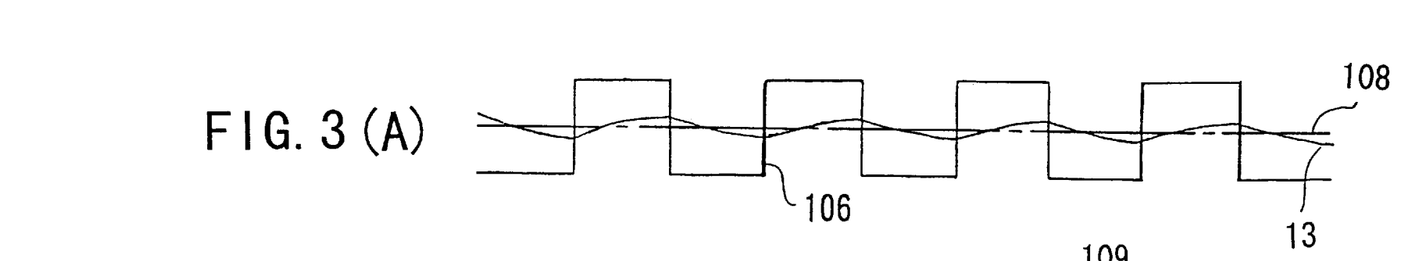
FIG. 3(A) is a diagram showing a DC signal outputted from the detecting circuit shown in FIG. 2 when a rectangular wave is inputted to the detecting circuit.
FIG. 3(B) is a diagram showing a DC signal outputted from the detecting circuit shown in FIG. 2 when a rectangular wave which is of the same amplitude and the same duration as, but has a different pulse frequency from, the rectangular wave shown in FIG. 3(A) is inputted to the detecting circuit.

FIGS. 3(A) and 3(B) show outputted DC signals when rectangular waves are inputted to the detecting circuit. In FIGS. 3(A) and 3(B), the rectangular waves inputted to the detecting circuit are the same as those inputted to the detecting circuit in FIGS. 11(A) and 11(B). Therefore, those signals shown in FIGS. 3(A) and 3(B) which are identical to those shown in FIGS. 11(A) and 11(B) are denoted by identical reference numerals. When the rectangular wave shown in FIG. 3(A) is inputted, the output terminal 2 outputs a DC signal 13 which has a level substantially in agreement with the average level 108 of the inputted signal. When the rectangular wave shown in FIG. 3(B) is inputted, the output terminal 2 outputs a DC signal 14 which has a level substantially in agreement with the average level 111 of the inputted signal.

As described above, the detecting circuit according to the first embodiment can produce an outputted DC signal depending on the power level of the inputted signal even if inputted signals are modulated differently or have different waveforms or the like.

Generally, the internal resistance of a diode varies depending on the voltage applied thereto. According to the first embodiment, the diodes D1, D2 have the same characteristics as each other. Therefore, even when an inputted voltage varies greatly, causing the internal resistance of the diodes D1, D2 to vary, it is possible to keep the impedances of the rectifier block 3 and the load block 5 equal to each other at all times, and equalize the time constants when the capacitor is charged and discharged.

Figure 4:
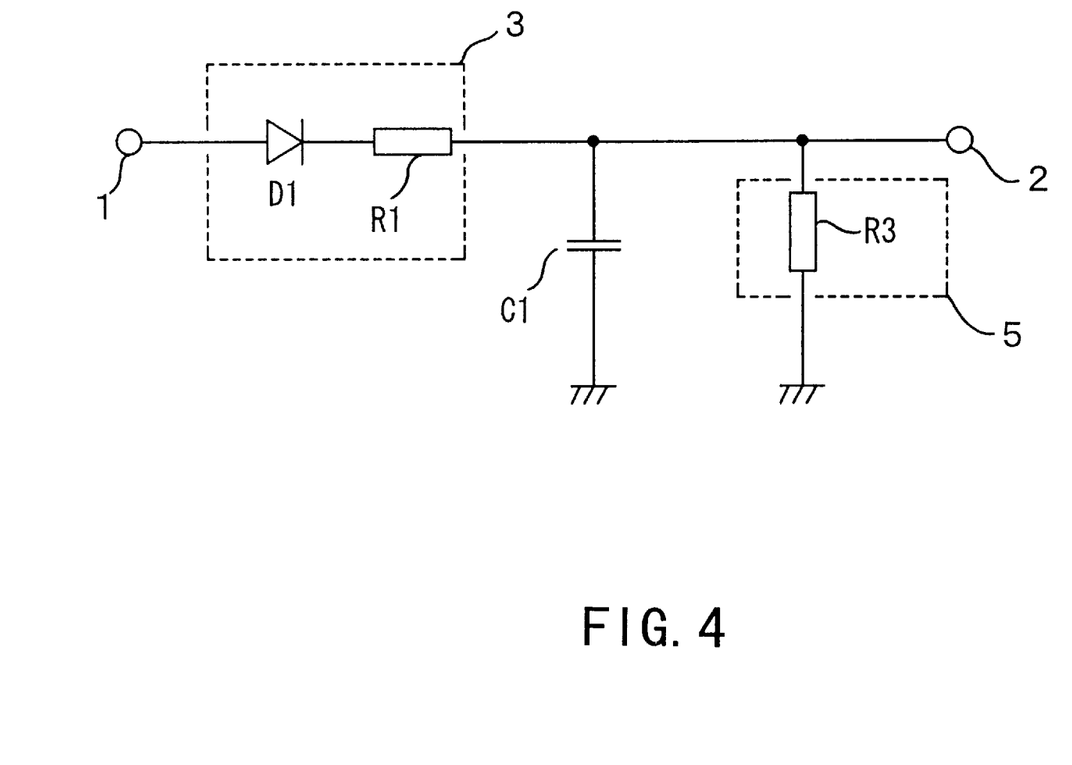
FIG. 4 is a circuit diagram of a detecting circuit according to a second embodiment of the present invention.

FIG. 4 shows a detecting circuit according to a second embodiment of the present invention. The detecting circuit according to the second embodiment is basically the same as the detecting circuit according to the first embodiment. Those parts shown in FIG. 4 which are identical to those shown in FIG. 2 are denoted by identical reference numerals, and only those parts shown in FIG. 4 which are different from those shown in FIG. 2 will be described in detail below.

According to the second embodiment, the load block 5 comprises a resistor R3 only. The resistor R3 has a resistance which is equal to the sum of the resistances of the diode D1 and the resistor R1 in the rectifier block 3.

A time constant $(R1+R_{D1}) \times C1$ when the capacitor C1 is charged is equal to a time constant $R3 \times C1$ when the capacitor C1 is discharged. Therefore, the detecting circuit according to the second embodiment can produce an outputted DC signal depending on the power level of the inputted signal even if inputted signals are modulated differently or have different waveforms or the like.

Inasmuch as the internal resistance of the diode D1 varies depending on the voltage applied thereto, the detecting circuit according to the second embodiment is effective in applications where the inputted voltage does not vary largely. The detecting circuit according to the second embodiment is more advantageous than the detecting circuit according to the first embodiment in that one diode can be removed from the load block 5.

Figure 5:
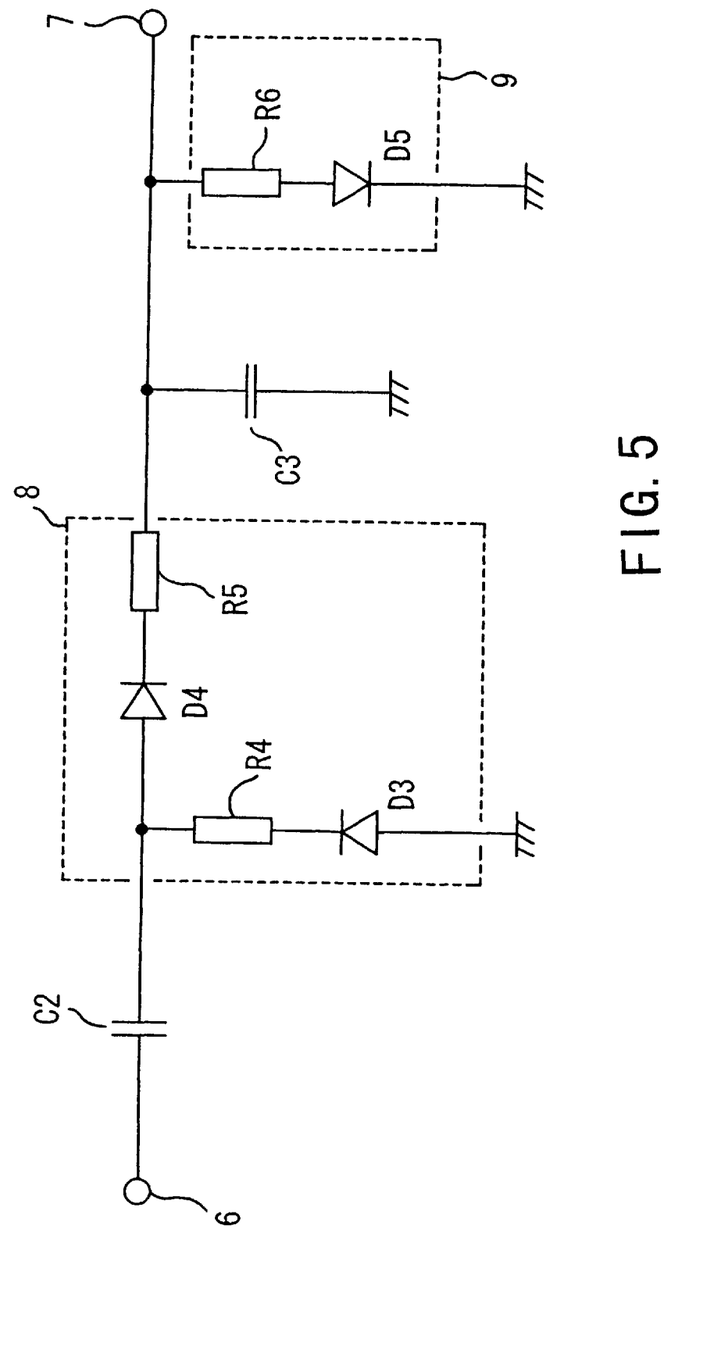
FIG. 5 is a circuit diagram of a detecting circuit according to a third embodiment of the present invention.

FIG. 5 shows a detecting circuit according to a third embodiment of the present invention. As shown in FIG. 5, a capacitor C2 and a rectifier block 8 are connected between an input terminal 6 and an output terminal 7. The rectifier block 8 comprises a first series-connected circuit of a diode D3 and a resistor R4 and a second series-connected circuit of a diode D4 and a resistor R5. The first series-connected circuit has an end connected to the capacitor C2 and an opposite end grounded, and the second series-connected circuit has an end connected to the capacitor C2 and an opposite end connected to the output terminal 7.

A capacitor C3 and a load block 9 are connected to a junction between the rectifier block 8 and the output terminal 7, and have respective ends grounded. The load block 9 comprises a series-connected circuit of a resistor R6 and a diode D5.

The capacitors C2, C3, the diodes D3, D4, and the resistors R4, R5 have values selected such that a time constant of the capacitor C2, the diode D3, and the resistor R4 is equal to a time constant of the capacitor C3, the diode D4, and the resistor R5. The capacitor C3, the diodes D4, D5, and the resistors R5, R6 have values selected such that a time constant of the capacitor C3, the diode D4, and the resistor R5 is equal to a time constant of the capacitor C3, the diode D5, and the resistor R6.

An inputted signal applied to the input terminal 6 is rectified in a negative amplitude range thereof by the diode D3 in the rectifier block 8 and stored in the capacitor C2. Then, in a positive amplitude range, the inputted signal, together with the electric energy stored in the capacitor C2, is rectified by the diode D4 and stored in the capacitor C3. Since the time constant $(R4+R_{D3}) \times C2$ when the capacitor C2 is charged is equal to the time constant $(R5+R_{D4}) \times C3$ when the capacitor C3 is charged, there is no difference between rates at which they are charged and discharged. $R_{D3}$, $R_{D4}$ represent resistances of the diodes D3, D4, respectively.

In a negative amplitude range, the electric energy stored in the capacitor C3 is discharged through the load block 9. The time constant $(R6+R_{D5}) \times C3$ when the capacitor C3 is discharged is equal to the time constant $(R5+R_{D4}) \times C3$ when the capacitor C3 is charged, where RD5 represents a resistance of the diode D5. Accordingly, as with the detecting circuit according the first embodiment, the detecting circuit according the third embodiment can produce an outputted DC signal depending on the power level of the inputted signal even if inputted signals are modulated differently or have different waveforms or the like.

Figure 6:
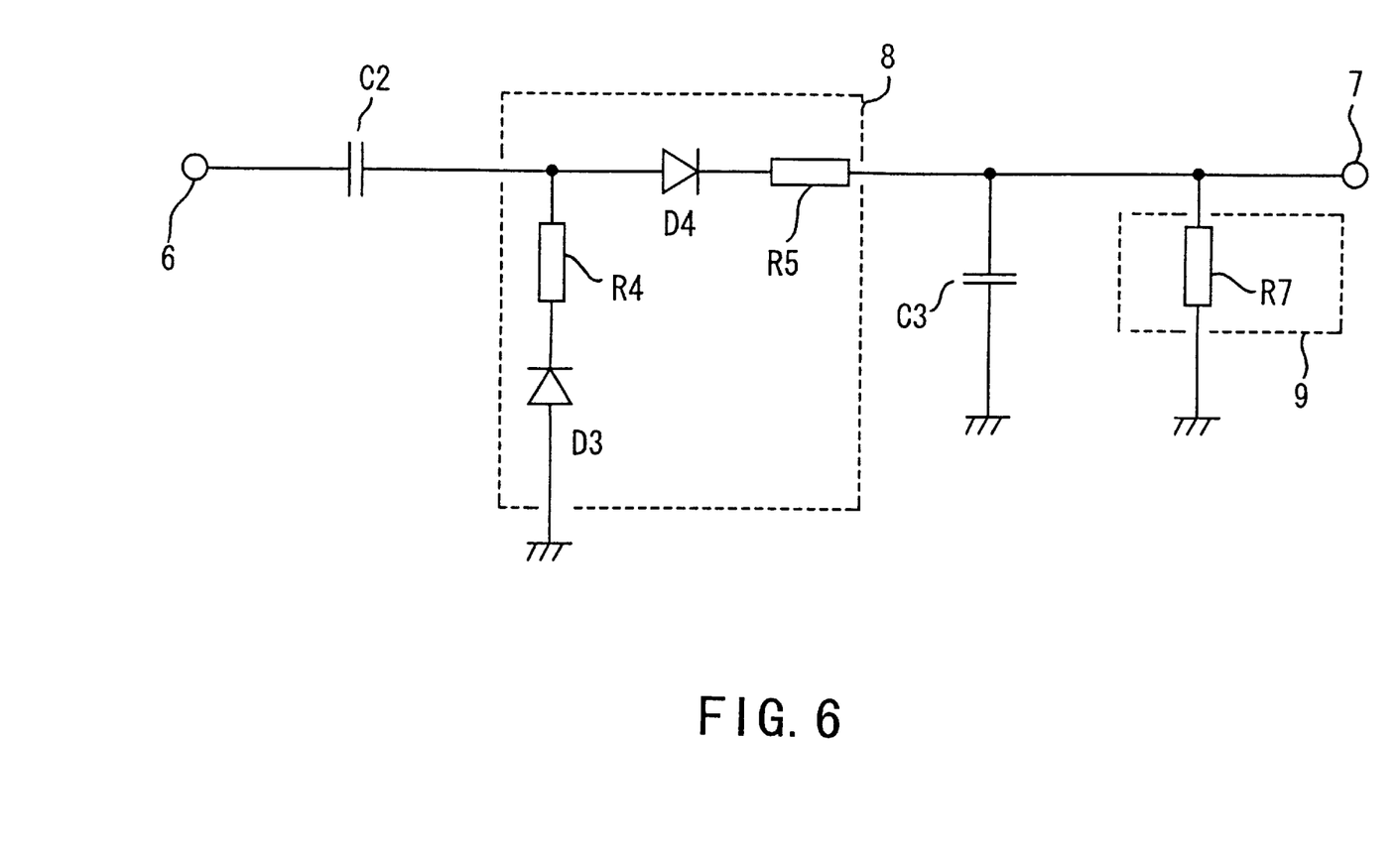
FIG. 6 is a circuit diagram of a detecting circuit according to a fourth embodiment of the present invention.

FIG. 6 shows a detecting circuit according to a fourth embodiment of the present invention. The detecting circuit according to the fourth embodiment is basically the same as the detecting circuit according to the third embodiment. Those parts shown in FIG. 6 which are identical to those shown in FIG. 5 are denoted by identical reference numerals, and only those parts shown in FIG. 5 which are different from those shown in FIG. 5 will be described in detail below.

According to the fourth embodiment, the load block 9 comprises a resistor R7 only. The resistor R7 has a resistance selected such that a time constant of the capacitor C3, the diode D4, and the resistor R5 is equal to a time constant of the capacitor C3 and the resistor R7.

Therefore, the time constant $(R5+R_{D4}) \times C3$ when the capacitor C3 is charged is equal to the time constant $R7 \times C3$ when the capacitor C3 is discharged. Therefore, the detecting circuit according to the fourth embodiment can produce an outputted DC signal depending on the power level of the inputted signal even if inputted signals are modulated differently or have different waveforms or the like.

The detecting circuit according to the fourth embodiment is effective in applications where the inputted voltage does not vary largely. The detecting circuit according to the fourth embodiment is more advantageous than the detecting circuit according to the third embodiment in that one diode can be removed from the load block 9.

If the time constants in the detecting circuits according to the above embodiments are selected to produce envelopes, it is possible to use these detecting circuits in AM demodulators.

According to the present invention, as described above, the detecting circuits are arranged such that time constants when the capacitors are charged and discharged are equal to each other. The detecting circuits thus arranged are capable of eliminating differences between outputted DC signals due to different principles by which input signals are modulated and different waveforms of the input signals, and can produce outputted DC signals which accurately represent the power levels of inputted signals.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A detecting circuit for outputting a DC signal depending on the power of an inputted signal, comprising:
    a rectifier block connected between an input terminal of the detecting circuit and an output terminal of the detecting circuit and comprising a rectifying element and a resistive element;
    a capacitor having an end connected to a junction between said rectifier block and said output terminal and an opposite end connected to a common potential; and
    a load block connected parallel to said capacitor and having the same impedance as said rectifier block.

2. A detecting circuit according to claim 1, wherein said rectifier block comprises a series-connected circuit of a diode and a resistor.

3. A detecting circuit according to claim 1, wherein said load block comprises a series-connected circuit of a resistor and a diode.

4. A detecting circuit according to claim 1, wherein said load block comprises a resistor.

5. A detecting circuit for outputting a DC signal depending on the power of an inputted signal, comprising:
    a first capacitor having an end connected to an input terminal of the detecting circuit;
    a rectifier block having an end connected to an opposite end of said first capacitor and an opposite end connected to an output terminal of the detecting circuit, said rectifier block being comprising at least a rectifying element and a resistive element;
    a second capacitor having an end connected to a junction between said rectifier block and said output terminal and an opposite end connected to a common potential; and
    a load block connected parallel to said second capacitor and having the same impedance as said rectifier block.

6. A detecting circuit according to claim 5, wherein said rectifier block comprises:
    a first series-connected circuit having an end connected to the opposite end of said first capacitor and an opposite end connected to said common potential, said first series-connected circuit comprising a first diode and a first resistor connected in series thereto; and
    a second series-connected circuit having an end connected to the opposite end of said first capacitor and an opposite end connected to said output terminal, said second series-connected circuit comprising a second diode and a second resistor connected in series thereto.

7. A detecting circuit according to claim 6, wherein said first capacitor, said first diode, and said first resistor have a first time constant, and said second capacitor, said second diode, and said second resistor have a second time constant, said first time constant and said second time constant being equal to each other.

8. A detecting circuit according to claim 6, wherein said load block comprises a series-connected circuit of a third resistor and a third diode.

9. A detecting circuit according to claim 8, wherein said second capacitor, said second diode, and said second resistor have a second time constant, and said second capacitor, said third diode, and said third resistor have a third time constant, said second time constant and said third time constant being equal to each other.

10. A detecting circuit according to claim 6, wherein said load block comprises a fourth resistor.

11. A detecting circuit according to claim 10, wherein said second capacitor, said second diode, and said second resistor have a second time constant, and said second capacitor and said fourth resistor have a fourth time constant, said second time constant and said fourth time constant being equal to each other.

* * * * *